(12) United States Patent
Kuratomi et al.

(10) Patent No.: US 7,632,720 B2
(45) Date of Patent: Dec. 15, 2009

(54) METHOD OF MANUFACTURING A SEMICONDUCTOR DEVICE

(75) Inventors: Bunshi Kuratomi, Tokyo (JP); Fukumi Shimizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 491 days.

(21) Appl. No.: 11/495,718

(22) Filed: Jul. 31, 2006

(65) Prior Publication Data
US 2007/0057379 A1    Mar. 15, 2007

(30) Foreign Application Priority Data
Sep. 15, 2005    (JP)   ............ 2005-268836

(51) Int. Cl.
*H01L 21/00* (2006.01)
(52) U.S. Cl. ............... 438/127; 438/126; 264/272.15; 264/272.17; 264/275; 425/125; 425/127; 257/E21.502; 257/E21.504
(58) Field of Classification Search ............... 438/128
See application file for complete search history.

(56) References Cited

U.S. PATENT DOCUMENTS 6,114,192 A * 9/2000 Tsunoda et al. ............ 438/126
6,333,211 B1 * 12/2001 Sato et al. .................. 438/126
6,365,432 B1 * 4/2002 Fukutomi et al. ........... 438/106
6,635,209 B2 * 10/2003 Huang ....................... 264/154

FOREIGN PATENT DOCUMENTS

JP    2003-318210 A    11/2003

* cited by examiner

*Primary Examiner*—David A Zarneke
(74) *Attorney, Agent, or Firm*—Miles & Stockbridge P.C.

(57) ABSTRACT

In connection with a memory card of a block molding type there is provided a method able to prevent the occurrence of a chip crack in transfer molding. The method includes a first step wherein a substrate having plural chips constituting plural memory cards and mounted on a surface of the substrate and further having connecting terminals in recesses formed on a substrate surface opposite to the chips-mounted surface is sandwiched between a first die (upper die) installed on the chips-mounted surface side and a second die (lower die) installed on the surface side where the connecting terminal are formed. The method further includes a second step of injecting sealing resin between the first die and the substrate to seal at a time the plural chips mounted on the substrate. Projecting portions (terminal supporting elements) projecting from the surrounding portion are formed in regions of the second die which regions are positioned just under the connecting terminals. The projecting portions support the connecting terminals in the second step.

10 Claims, 8 Drawing Sheets

METHOD OF MANUFACTURING A SEMICONDUCTOR DEVICE

CROSS-REFERENCE TO RELATED APPLICATION

The present application claims priority from Japanese patent application No. 2005-268836 filed on Sep. 15, 2005, the content of which is hereby incorporated by reference into this application.

BACKGROUND OF THE INVENTION

The present invention relates to a method of manufacturing a semiconductor device and particularly to a technique applicable effectively to a process of packaging a semiconductor chip (hereinafter referred to simply as "chip") used in a semiconductor memory card (simply "memory card" hereinafter).

For example, the following techniques have been studied by the present inventors.

For example, as a technique for packaging a substrate with chips mounted thereon, there is known a transfer molding method. According to the transfer molding method, an epoxy resin is compressed and hardened into cylindrical tablets, then the tablets are melted and injected into a mold, followed by the application of heat and pressure, to seal the chips on the substrate with the epoxy resin which substrate is loaded into the mold beforehand.

As molding methods there are known an individual molding type and a block molding type called MAP. The individual molding type is a conventional method of molding product by product. The block molding type is a method wherein the number of products per substrate is increased to reduce the cost and improve the productivity and material yield in molding. According to the block molding type, a large number of chips are mounted on a substrate and their surfaces are sealed with resin at a time, then the substrate is cut into individual products.

Figure 8:
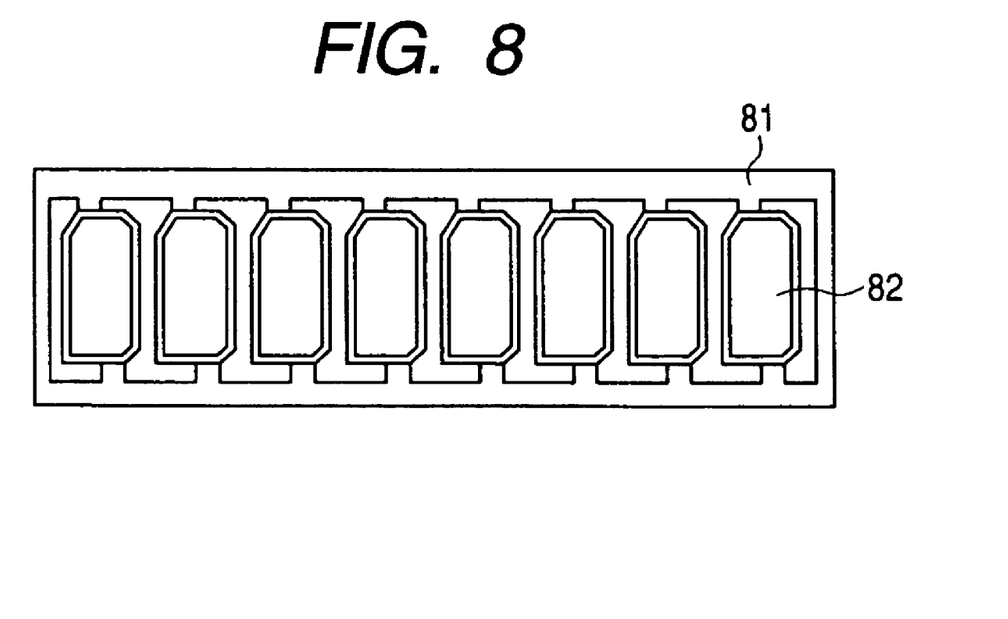
FIG. 8 illustrates a package shape after molding of memory cards of the individual molding type which has been studied as a premise of the present invention.

FIG. 8 shows a package shape after molding of memory cards obtained by the individual molding method. According to the individual molding method, as shown in the same figure, plural memory cards 82 are sealed with resin on a substrate 81. The substrate 81 is then divided into individual memory cards.

Figure 9:
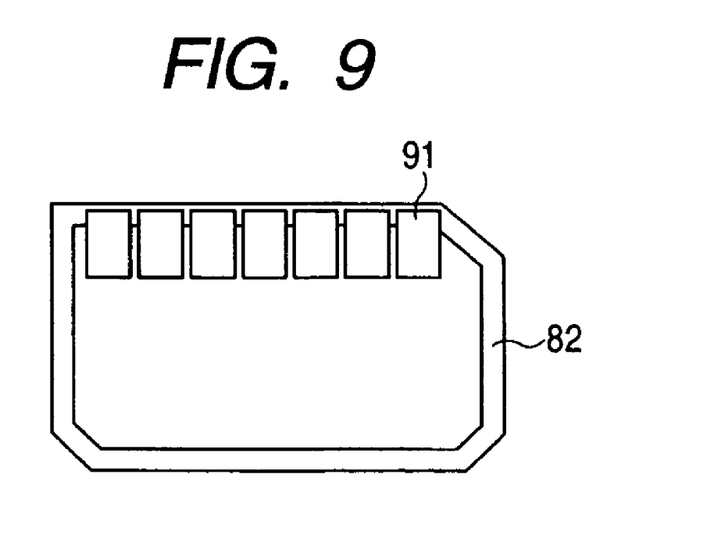
FIG. 9 is a back view showing a package shape of a memory card after division into individual products which has been studied as a premise of the present invention.

FIG. 9 shows a package shape of a memory card after the division. FIG. 9 is a view as seen from a back-side terminal surface. As shown in the same figure, plural connecting terminals 91 are arranged on the back surface of the memory card 82.

For example, the technique disclosed in Patent Literature 1 is known as a transfer molding technique of the individual molding type.

[Patent Literature 1]
Japanese Unexamined Patent Publication
No. 2003-318210

SUMMARY OF THE INVENTION

The following became clear as a result of a study made by the present inventors in connection with the aforesaid transfer molding technique.

For example, the transfer molding of the block molding type is carried out in the following manner exclusive of memory card products. First, before setting a substrate into a molding die, a release film is laminated onto a package molding surface of an upper die and thereafter a substrate is set into a lower die. Once the substrate is set into the lower die, the heat of the molding die is transmitted to the substrate, causing the substrate to warp. If molding is performed in such a warped state of the substrate, wires which connect chips and the substrate with each other come into contact with the upper die and are deformed. To prevent this defect, just after setting of the substrate into the molding die, an outer periphery surface of the substrate as a position not interfering with chips and wires is held down forcibly and the substrate is sucked to prevent warping thereof. Then, in the thus-sucked state of the substrate, the molding die is clamped and molding is performed.

The memory card of the block molding type is different particularly in substrate structure from other block molding type products. More particularly, in the memory card, a large number of connecting terminals (gold leads) for connection to an external connection device (e.g., card reader) are arranged on a back surface opposite to the chip mounting surface. The surfaces of the connecting terminals are recessed about 5 to 50 µM from an upper surface position of the substrate back surface to prevent damage of the connecting terminals when connected to or disconnected from an external connection device.

Figure 10:
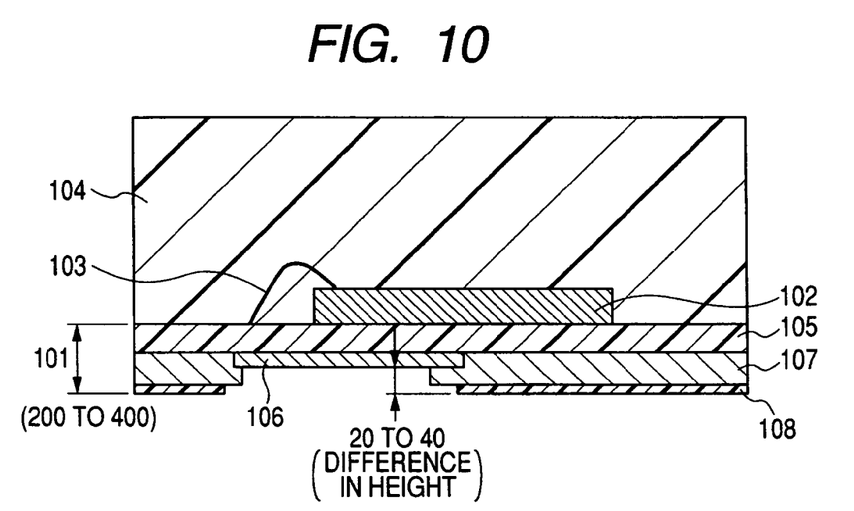
FIG. 10 is a sectional view showing a package structure of a memory card of the block molding type which has been studied as a premise of the present invention.

FIG. 10 is a sectional view of a package of a block molding type memory card. In this memory card, as shown in the same figure, a chip 102 is mounted on a substrate 101 of 100 to 400 µm in thickness, is wire-bonded with wire 103 and is packaged with sealing resin 104. The substrate 101 is constructed such that a core 105, with connecting terminals 106 of copper (Cu) for example arranged thereon, is coated with SR (solder resist) 107 and silk 108 forming an insulating coat or film. The connecting terminals 106 are exposed in a concave shape so that they can be connected to an external connection device, with a difference in height being 20 to 40 µm from a surface (the surface of the silk 108) of the substrate 101.

In such a block molding type memory card, a chip is mounted at a position just above the connecting terminals, and if molding is performed in this state, there is a fear that the following problem may occur.

Figure 11:
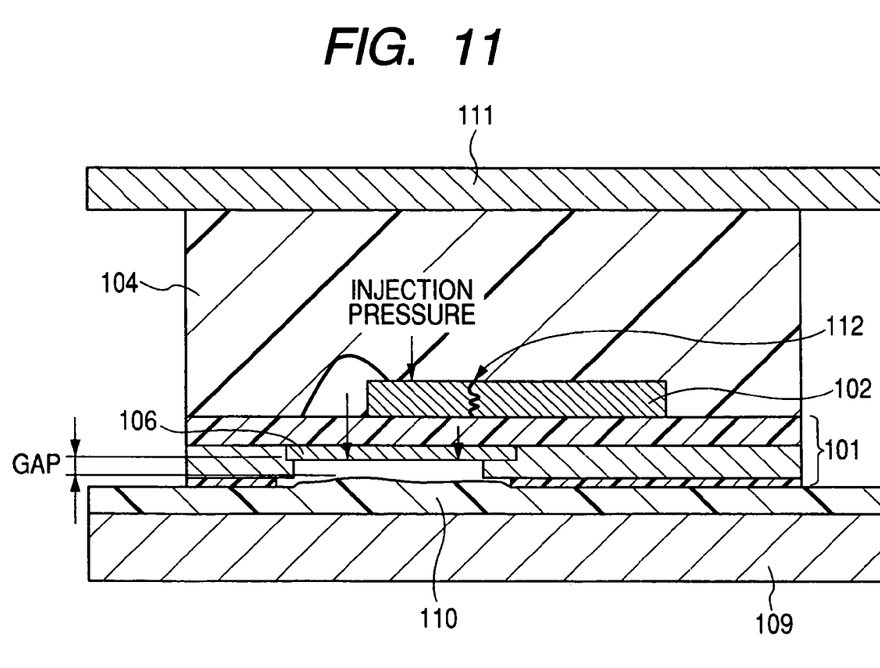
FIG. 11 is a sectional view showing a state in molding of a memory card of the block molding type which has been studied as a premise of the present invention.

FIG. 11 is a sectional view showing a molding state. At the time of molding, as shown in the same figure, a film 110 is laminated onto a cavity 109 of a lower die and an upper film 111 is laminated onto the upper die (not shown). In the meantime, the substrate 101 with the chip 102 mounted thereon is set and sealing resin 104 is injected into the upper die to effect molding. In this case, since the connecting terminals 106 are formed in recesses on the substrate back side, there is a gap of about 20 to 40 µm between the connecting terminals 106 and the lower die. With this gap, a resin injection pressure (4.9 to 6.8 MPa) in molding is applied onto the chip 102, whereby the chip 102 is forced down and so is the substrate 101, with a consequent fear of occurrence of a chip crack 112.

Accordingly, it is an object of the present invention to provide a technique able to prevent the occurrence of a chip crack in transfer molding. It is another object of the present invention to improve the semiconductor device manufacturing yield.

The above and other objects and novel features of the present invention will become apparent from the following description and the accompanying drawings.

The following is an outline of a typical mode of the present invention as disclosed herein.

According to a semiconductor device manufacturing method of the present invention, surfaces of memory cards with chips arranged on a surface of a substrate and connecting terminals arranged in recesses formed in a back surface of the substrate are subjected to block molding (sealing with resin)

in a state in which projecting portions (supporting elements) are provided under the connecting terminals on the substrate back surface.

More specifically, the semiconductor device manufacturing method according to the present invention comprises a first step of sandwiching a substrate between a first die (upper die) and a second die (lower die), the substrate having on one surface thereof a plurality of chips which constitute a plurality of memory cards and further having a plurality of connecting terminals formed in recesses on a surface opposite to the one surface of the substrate, the first die being installed on the substrate surface side with the chips mounted thereon, the second die being installed on the substrate surface side with the connecting terminals formed thereon, and a second step of injecting resin between the first die and the substrate to seal the plural chips on the substrate at a time with the resin, wherein projecting portions projecting from the surrounding portion are formed in regions of the second die which regions are positioned just under the connecting terminals, the projecting portions supporting the connecting terminals in the second step.

The following is a brief description of an effect obtained by the typical mode of the present invention as disclosed herein.

The occurrence of a chip crack can be prevented. Further, it is possible to improve the semiconductor device manufacturing yield.

BRIEF DESCRIPTION OF THE DRAWINGS

FIGS. 3(a) and 3(b) illustrate a detailed construction of a terminal receiving element in the semiconductor device manufacturing method, of which

FIGS. 4(a), 4(b), and 4(c) illustrate an external shape of a substrate before molding in the semiconductor device manufacturing method, of which

FIGS. 5(a) and 5(B) illustrate a state of chips being mounted on the substrate in the semiconductor device manufacturing method, of which

FIGS. 6(a) and 6(b) are outline diagrams of the substrate after molding in the semiconductor device manufacturing method, of which

DETAILED DESCRIPTION OF A PREFERRED EMBODIMENT

An embodiment of the present invention will be described in detail hereinunder with reference to the accompanying drawings. In all of the drawings for illustrating the embodiment, the same members are identified by the same reference numerals in principle, and tautological explanations thereof will be omitted.

Figure 1:
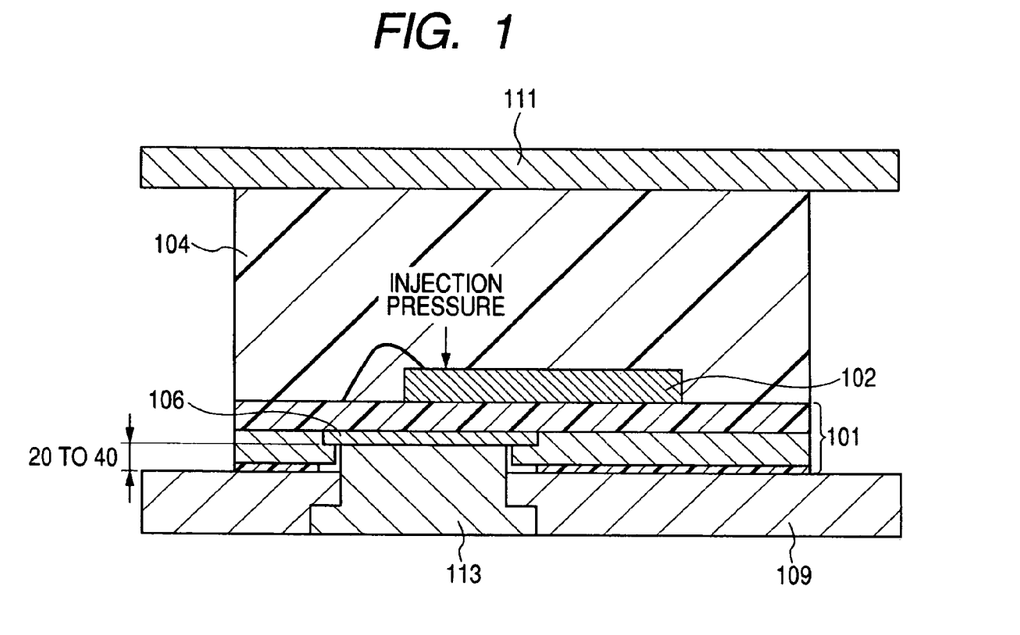
FIG. 1 is a sectional view showing a state of molding in the absence of a lower film in a semiconductor device manufacturing method according to an embodiment of the present invention.
Figure 2:
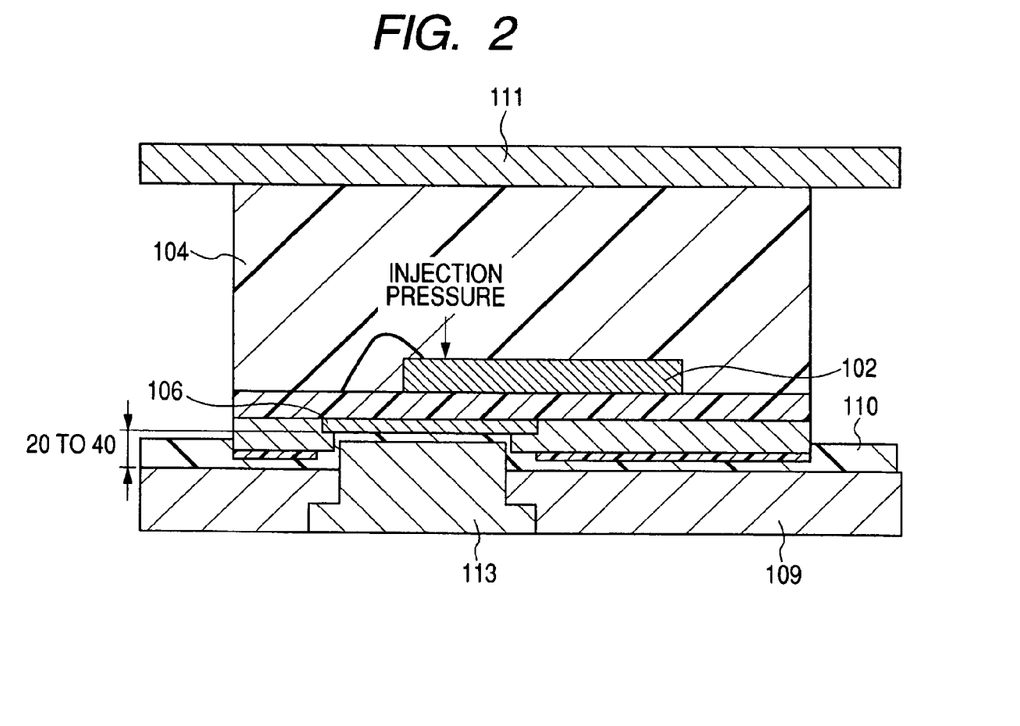
FIG. 2 is a sectional view showing a state of molding in the presence of upper and lower films in the semiconductor device manufacturing method.

FIG. 1 is a sectional view showing a state of molding in the absence of a lower film in a semiconductor device manufacturing method according to an embodiment of the present invention and FIG. 2 is a sectional view showing a state of molding in the presence of upper and lower films.

First, with reference to FIG. 1, a description will be given about an example of construction of a molding die used in this embodiment. In the molding die used in this embodiment, projecting portions (terminal supporting, elements 113) for supporting connecting terminals are provided in a cavity portion (a lower die cavity 109) of a molding lower die with a substrate 101 set therein and at positions in contact with the positions of connecting terminals 106. The projecting portions provided in the lower cavity 109 are projected by 5 to 50 μm from an upper surface position of the lower cavity so that the height thereof becomes equal to the difference in height between an upper position of a back surface of the substrate and an upper surface position of the connecting terminals. The projecting portions are formed by fitting another member into holes formed in the lower cavity 109.

Next, a description will be given about a molding process in the semiconductor device manufacturing method of this embodiment. In molding, as shown in FIG. 1, an upper film 111 is laminated to an upper die (not shown), then the substrate 101 with chips 102 mounted thereon is set between the upper film 111 and the lower die cavity 109, and sealing resin 104 is injected into the upper die to effect molding.

More specifically, the semiconductor device manufacturing method of this embodiment includes a first step wherein the substrate 101 with plural connecting terminals 106 formed in recesses of the surface opposite to the mounted surface of plural chips 102 which constitute plural memory cards is sandwiched between a first die (upper die) installed on the surface side where the chips 102 are mounted and a second die (lower die) installed on the surface side where the connecting terminals 106 are formed. The semiconductor device manufacturing method also includes a second step of injecting sealing resin 104 between the first mold and the substrate 101 to seal the plural chips 102 on the substrate 101 at a time. Projecting portions (terminal supporting elements 113) projecting from the surrounding portion are formed in regions of the second die which regions are positioned just under the connecting terminals 106. In the second step, the projecting portions support the connecting terminals 106. The semiconductor device manufacturing method further includes after the second step a third step of cutting the substrate 101 into plural memory cards. The chips 102 are each a semiconductor chip for a memory card including a flash memory and a controller. Though not shown, such flash memory chip and controller chip may be mounted in a stacked state within each memory card. The capacity of each memory card can be made larger by mounting plural flash memory chips.

In case of using both upper and lower films, as shown, in FIG. 2, molding is performed after laminating a lower film 110 onto the lower cavity 109 of the lower die. In this case, the lower film 110 is sandwiched between the projecting portions formed in the second die and the connecting terminals 106.

Figure 3A:
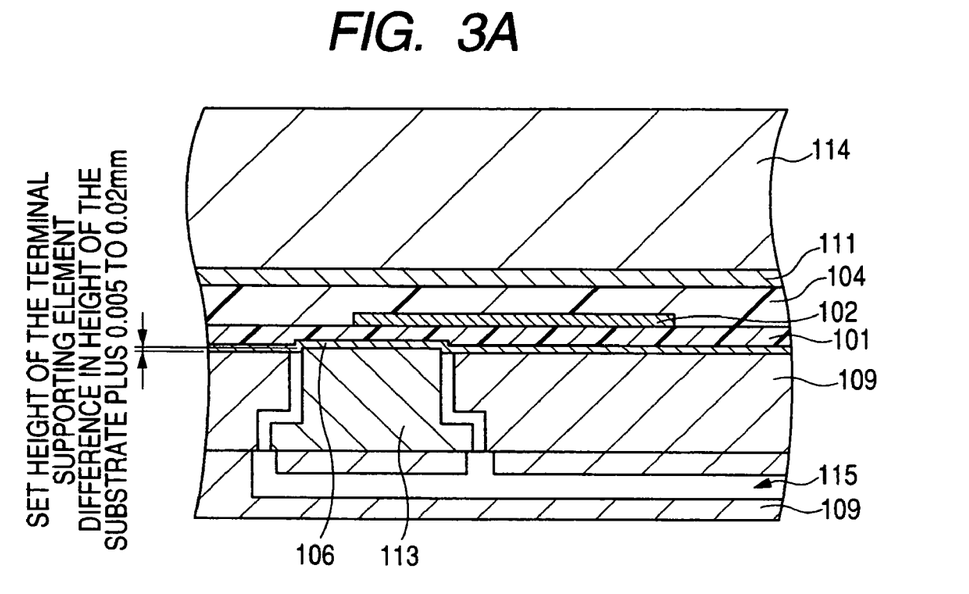
FIG. 3(a) is a sectional view and FIG. 3(b) is a top view.
Figure 3B:
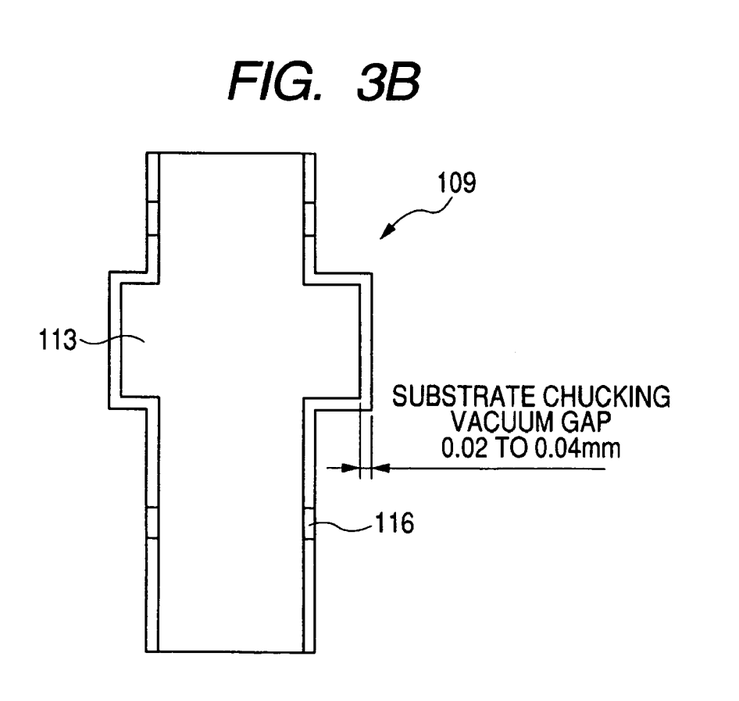

FIGS. 3(a) and 3(b) illustrate a detailed construction of each terminal supporting element 113, of which FIG. 3(a) is a sectional view and FIG. 3(b) is a top view. In FIG. 3(a), an upper die 114 (a first die) overlies the upper film 111.

As shown in FIG. 3(a), the terminal supporting element 113 (a projecting portion formed in the second die) in the lower cavity 109 is provided with a suction mechanism for chucking the substrate 101. More particularly, a slight gap (a substrate chucking vacuum gap) is formed between the lower cavity 109 and the terminal supporting element 113 and the substrate 101 is chucked by suction through a substrate chucking vacuum hole 115. Gap ensuring lugs 116 are formed to ensure the formation of the substrate chucking vacuum gap. It is preferable that the terminal supporting element 113 be set at a height corresponding to a difference in height of the substrate plus (0.005 to 0.02 mm).

As shown in FIG. 3(b), gap ensuring lugs 116 are formed between the lower cavity 109 and the terminal supporting element 113. It is preferable that the substrate chucking vacuum gap be 0.02 to 0.04 mm in width.

As set forth above, projecting portions are formed in the lower die cavity portion and the connecting terminals on the substrate back surface are supported by the projections when the substrate is set to the lower die. As a result, there is no gap between the connecting terminal surfaces on the substrate back surface and the lower die cavity surface, whereby the occurrence of a chip crack in the absence of such projecting portions can be prevented. This effect becomes more and more effective as the chip thickness becomes smaller from 110 μm to 90, 70, and 50 μm. In this embodiment, the substrate thickness is 130 to 260 μm, the thickness of the whole of each memory card is about 2 mm, and the molding thickness is about 300 to 800 μm.

Figure 4A:
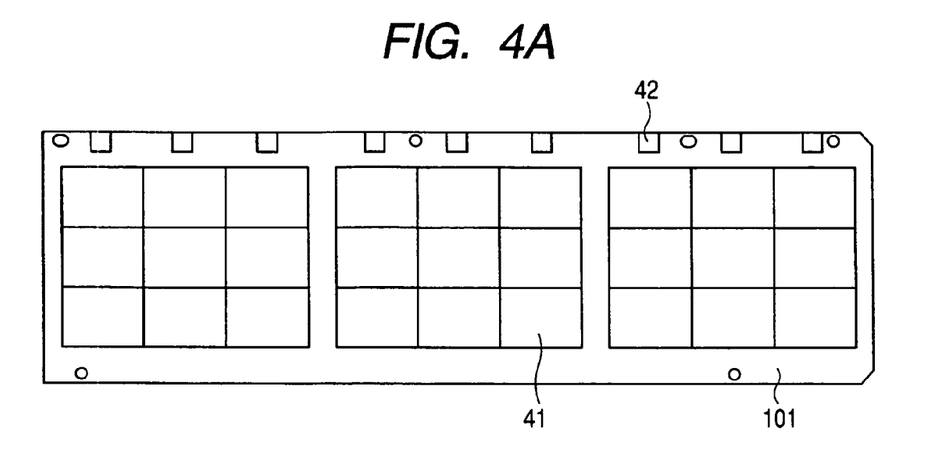
FIG. 4(a) is a top view.
Figure 4B:
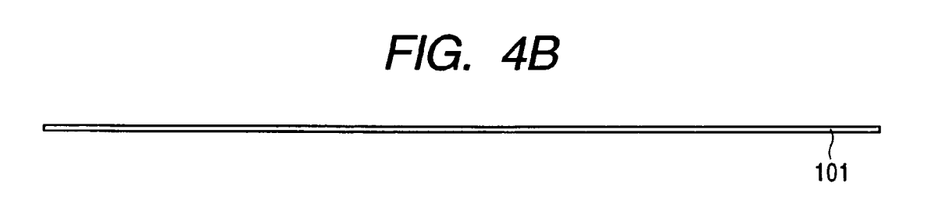
FIG. 4(b) is a side view.
Figure 4C:
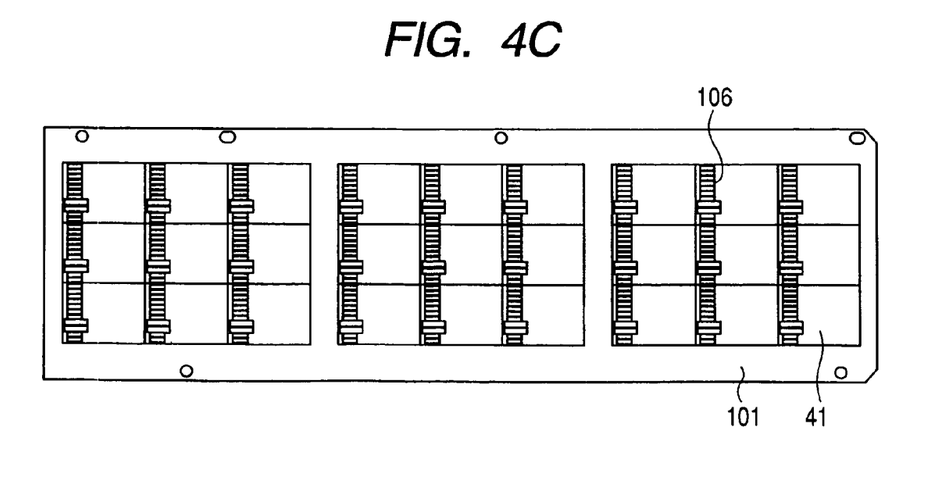
FIG. 4(c) is a back view.

FIGS. 4(a), 4(b), and 4(c) illustrate the substrate 101 before molding, of which FIG. 4(a) is a top view, FIG. 4(b) is a side view, and FIG. 4(c) is a back view. In FIG. 4, twenty-seven individual products 41 are arranged and plural gates 42 are formed on one side. Further, the connecting terminals 106 are arranged on the back surface of the substrate 101 correspondingly to the individual products 41.

Figure 5A:
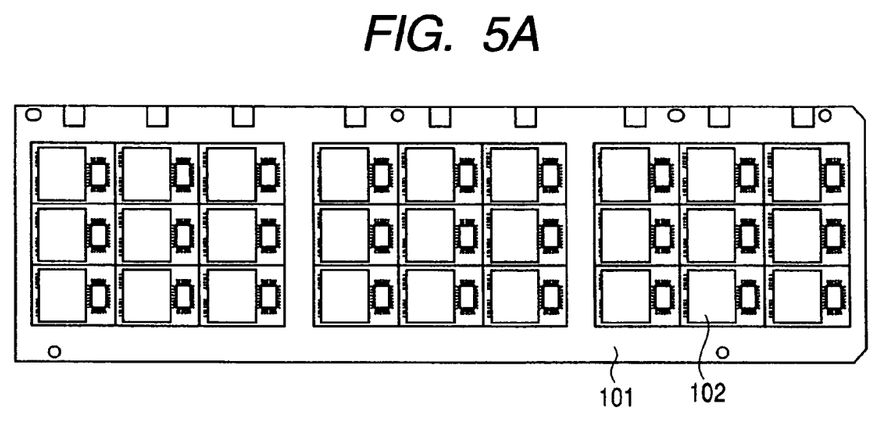
FIG. 5(a) is a top view and FIG. 5(b) is a side view.
Figure 5B:
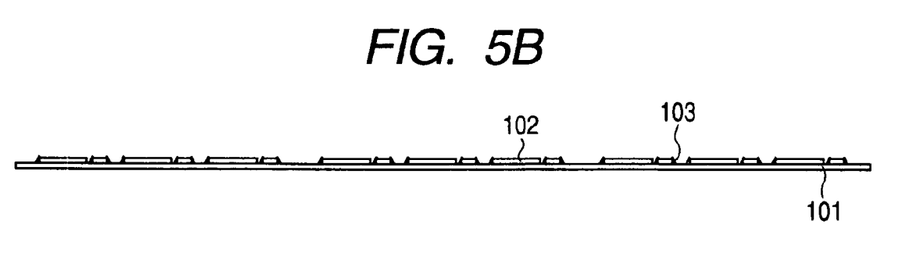

FIGS. 5(a) and 5(b) show a state in which chips 102 are mounted on the substrate 101, of which FIG. 5(a) is a top view and FIG. 5(b) is a side view. In FIG. 5, two chips are mounted for each individual product 41. The chips 102 are wire-bonded using Au wires 103.

Figure 6A:
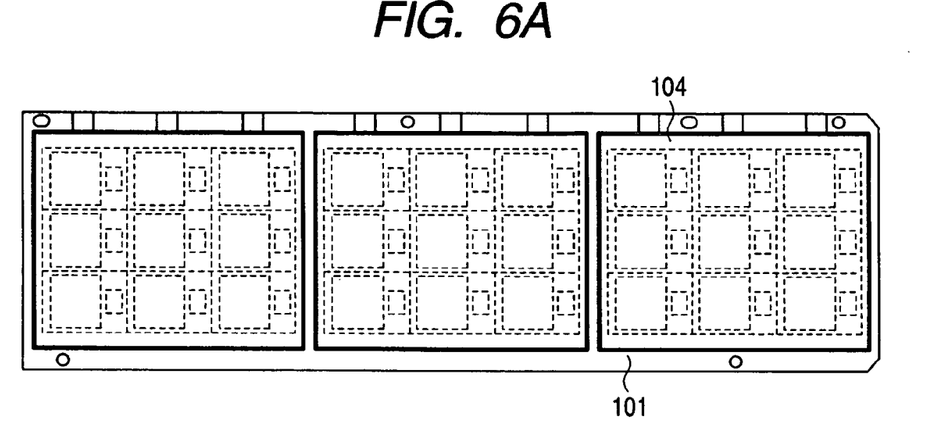
FIG. 6(a) is a top view and FIG. 6(b) is a side view.
Figure 6B:
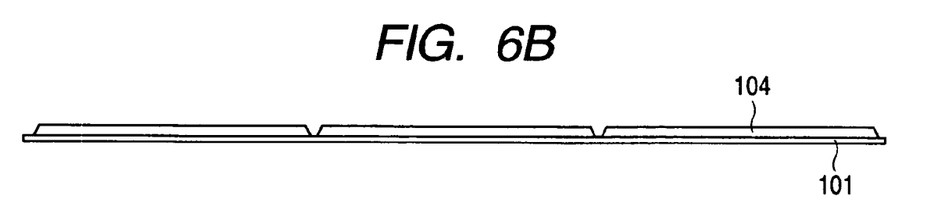

FIGS. 6(a) and 6(b) illustrate an external shape of the substrate 101 after molding, of which FIG. 6(a) is a top view and FIG. 6(b) is a side view. In FIG. 6, nine chips 102 are sealed all together with sealing resin 104.

Figure 7:
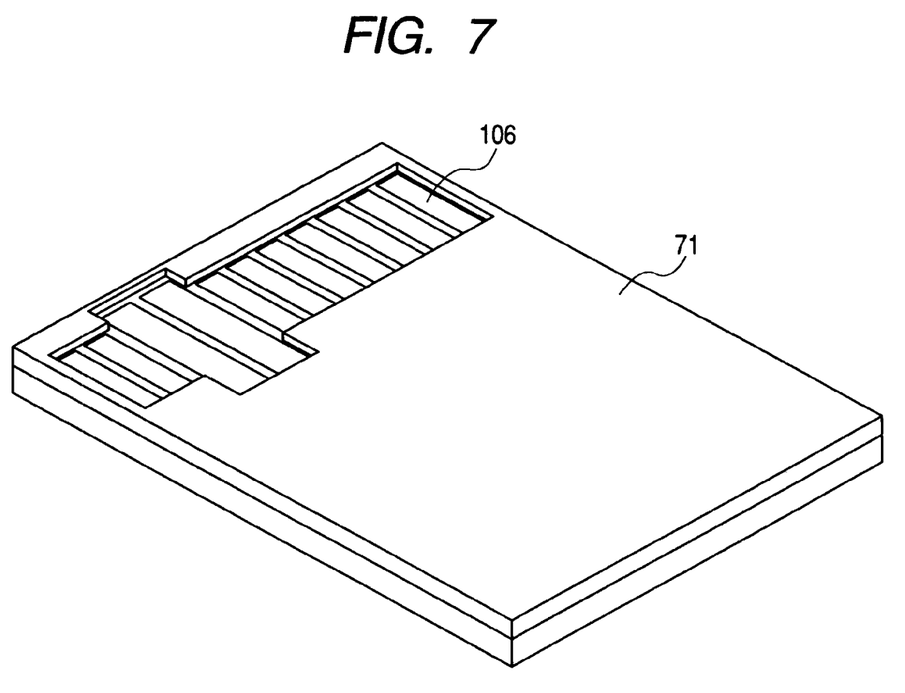
FIG. 7 is a back view showing an external shape of a product after cutting the substrate into individual products in the semiconductor device manufacturing method.

FIG. 7 is a back view showing an external shape of a product obtained by cutting the substrate 101 into individual products. Such a memory card 71 as shown in FIG. 7 is produced by cutting the substrate 101 shown in FIG. 6 into individual products 41.

The present invention has been described above concretely by way of an embodiment thereof. However, it goes without saying that the present invention is not limited to the above embodiment, but that various changes may be made within the scope not departing from the gist of the invention.

The present invention is applicable to the manufacturing industry for the manufacture of semiconductor devices and electronic devices.

What is claimed is:

1. A method of manufacturing a semiconductor device, comprising:
   a first step of clamping a substrate between a first die and a second die, the substrate having over one surface thereof a plurality of semiconductor chips which constitute a plurality of memory cards and further having a plurality of connecting terminals over a surface opposite to the one surface of the substrate, the first die being disposed over the substrate surface side with the semiconductor chips mounted thereover, the second die being disposed on the substrate surface side with the connecting terminals formed thereover; and
   a second step of injecting resin between the first die and the substrate to seal the semiconductor chips over the substrate at a time with the resin,
   wherein the substrate has an electrically insulating coat over the surface opposite to the one surface of the substrate, and parts of multiple connecting terminals of the plurality are exposed from a single opening in the insulating coat, and
   wherein projecting portions projecting from a surrounding portion are formed in regions of the second die which regions are positioned just under the connecting terminals, and each of the projecting portions supports the multiple connecting terminals through the single opening in the insulating coat in the second step.

2. A method according to claim 1, wherein the semiconductor chips are arranged just above the connecting terminals.

3. A method according to claim 1, further comprising, after the second step, a third step of cutting the substrate into each of the plural memory cards.

4. A method according to claim 1, wherein a film is clamped between the projecting portions formed in the second die and the connecting terminals.

5. A method according to claim 1, wherein the projecting portions formed in the second die are each provided with a suction mechanism for chucking the substrate.

6. A method according to claim 1, wherein the semiconductor chips each include a flash memory and a controller.

7. A method according to claim 1, wherein the projecting portions formed in the second die are formed by fitting another member into holes formed in the second die.

8. A method according to claim 1, wherein the height of each of the projections formed in the second die is in the range of 5 to 50 μm.

9. A method according to claim 1, wherein the insulating coat includes solder resist.

10. A method of manufacturing a semiconductor device, comprising:
    preparing a substrate having a first surface, a second surface, connecting terminals formed on the second surface and an electrically insulating film formed on the connecting terminals and on the second surface, and a semiconductor chip mounted over the first surface of the substrate;
    clamping said substrate with said semiconductor chip between a first die and a second die having a first face and a second face protruding from said first face;
    injecting resin between said first surface of said substrate and said first die so as to form a sealing body covering said semiconductor chip and said first surface of said substrate,
    wherein said insulating film has an opening exposing said connecting terminals, and
    in said injecting step, said first face of said second die contacts said insulating film and said second face of said second die contacts said connecting terminals exposed from said opening in said insulating film.

* * * * *